United States Patent [19]

Campbell et al.

[11] Patent Number: 5,973,041
[45] Date of Patent: Oct. 26, 1999

[54] RESINOUS COMPOSITIONS CONTAINING AROMATIC BISPHOSPHORAMIDATES AS FLAME RETARDANTS

[75] Inventors: John Robert Campbell, Clifton Park, N.Y.; John Jeffrey Talley, St. Louis, Mo.

[73] Assignee: General Electric Company, Schenectady, N.Y.

[21] Appl. No.: 09/144,687

[22] Filed: Aug. 31, 1998

[51] Int. Cl.⁶ .................................................. C08K 5/49
[52] U.S. Cl. ........................ 524/117; 525/267; 528/196
[58] Field of Search ........................ 524/117; 525/267; 528/196

[56] References Cited

U.S. PATENT DOCUMENTS

| | | | |
|---|---|---|---|
| 2,971,929 | 2/1961 | Glade | 442/83 |
| 3,433,271 | 3/1969 | Holoch et al. | 528/176 |
| 3,640,823 | 2/1972 | Linderman et al. | 117/136 |
| 3,887,655 | 6/1975 | Shim | 558/84 |
| 3,966,478 | 6/1976 | Toy et al. | 106/18.16 |
| 3,997,505 | 12/1976 | Albright | 528/176 |
| 4,053,450 | 10/1977 | Golborn et al. | 524/117 |
| 4,632,946 | 12/1986 | Muench et al. | 523/179 |
| 5,352,830 | 10/1994 | Foa et al. | 564/12 |
| 5,468,530 | 11/1995 | Gotz et al. | 428/36.4 |
| 5,561,193 | 10/1996 | Gottschalk et al. | 528/176 |

FOREIGN PATENT DOCUMENTS 10175985  6/1998  Japan .

OTHER PUBLICATIONS

R. Wolfe, "Flame–retardant dope additives for regenerated cellulose fibers," 1978, pp. 248–269, Proc. Symp. Text. Flammability.

"Preparation of Sterically Hindered Phosphoramidates", John J. Talley, J. Chem. Engr. Data, 33,221–222 (1988).

*Primary Examiner*—Terressa Mosley
*Attorney, Agent, or Firm*—Noreen C. Johnson; Douglas E. Stoner

[57] ABSTRACT

Bisphosphoramidates such as N,N'-bis[di-(2,6-xylenoxy) phosphinyl]piperazine are effective flame retardant agents for thermoplastic polymers and blends thereof. In addition, the blends containing such bisphosphoramidates have excellent high temperature properties, as demonstrated by high heat deflection temperatures and a low tendency to decrease glass transition temperature.

13 Claims, No Drawings

RESINOUS COMPOSITIONS CONTAINING AROMATIC BISPHOSPHORAMIDATES AS FLAME RETARDANTS

BACKGROUND OF THE INVENTION

This invention relates to flame retardation, and more particularly to the use of a specific class of compounds as flame retardants for polymers.

Improvement of the fire resistant properties of polymers has long been a goal of polymer compounders. Fire resistance is typically evaluated by the UL-94 test of Underwriters Laboratories (ASTM procedure D3801). In this test, the desirable V-0 rating is given to polymers of which specimens do not burn with flaming combustion for more than 10 seconds after application of a test flame, and specimens do not burn with flaming combustion for a time exceeding 50 seconds upon 2 flame applications to each of 5 specimens; i.e., the total "flame-out time" (FOT) for said samples is not greater than 50 seconds.

Various types of chemical compounds may be employed as flame retardancy additives. They include halogenated and especially brominated compounds and phosphate-based compounds. Such additives are often employed in combination with anti-drip agents such as fluorocarbon polymers, and synergists such as antimony halides.

It is desirable in some instances to employ exclusively phosphate-based compounds. Among the compounds known to be useful for this purpose are the bis(diaryl phosphate) esters of dihydroxyaromatic compounds, as illustrated by resorcinol bis(diphenyl phosphate), hydroquinone bis(diphenyl phosphate) and bisphenol A bis (diphenyl phosphate). These compounds, however, frequently also have undesirable effects on the high temperature properties of the polymer substrates, as demonstrated by a pronounced decrease in heat deflection temperature (HDT) and/or glass transition temperature (Tg).

It is of interest, therefore, to develop resinous blends containing phosphate-based flame retardant additives having a minimum effect on the high temperature properties of the blends.

SUMMARY OF THE INVENTION

The present invention is based on the discovery of a class of phosphate-based additives which afford the desired degree of flame retardancy to thermoplastic polymers, accompanied by an effect on high temperature properties which is significantly less than that observed with other additives having related molecular structures.

The invention includes resinous compositions comprising a major amount of at least one thermoplastic polymer and a minor flame retarding amount of at least one aromatic bisphosphoramidate of the formula

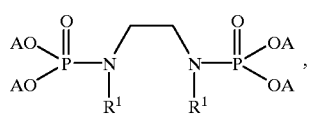
(I)

wherein A is a monocyclic aromatic radical and $R^1$ is a $C_{1-4}$ primary or secondary alkyl radical or both $R^1$ radicals taken together are ethylene.

DETAILED DESCRIPTION PREFERRED EMBODIMENTS

It has not been determined and is immaterial to the invention whether the components of the compositions of the invention undergo chemical interaction to form other materials. Therefore, the invention is directed to said compositions whether or not any chemical interaction has taken place. That is, the invention includes both compositions comprising said components and compositions comprising reaction products thereof.

The major constituent of the compositions of the invention is at least one thermoplastic polymer. Both addition and condensation polymers are included. Illustrative thermoplastic materials are olefin polymers such as polyethylene and polypropylene; polymers of ethylenically unsaturated carboxylic acids and their functional derivatives, including acrylic polymers such as poly(alkyl acrylates), poly(alkyl methacrylates), polyacrylamides, polyacrylonitrile and polyacrylic acid; alkenylaromatic polymers such as polystyrene; diene polymers such as polybutadiene and polyisoprene; polyamides such as nylon-6 and nylon-66; polyesters such as poly(ethylene terephthalate) and poly(1,4-butylene terephthalate); polycarbonates; and polyarylene ethers. Both homopolymers and copolymers are included, and the latter may be of the random, block or graft type. Thus, for example, suitable polystyrenes include homopolymers and copolymers. The latter embraces high impact polystyrene (HIPS), a genus of rubber-modified polystyrenes comprising blends and grafts wherein the rubber is a polybutadiene or a rubbery copolymer of about 70–98% styrene and 2–30% diene monomer. Also included are ABS copolymers, which are typically grafts of styrene and acrylonitrile on a previously formed diene polymer backbone (e.g., polybutadiene or polyisoprene).

Polycarbonates useful in the compositions of the invention include those comprising structural units of the formula

(III)

wherein at least about 60 percent of the total number of $R^2$ groups are aromatic organic radicals and the balance thereof are aliphatic, alicyclic, or aromatic radicals. More preferably, $R^2$ is an aromatic organic radical and still more preferably a radical of the formula

(IV)

wherein each $A^1$ and $A^2$ is a monocyclic divalent aryl radical and Y is a bridging radical in which one or two carbon atoms separate $A^1$ and $A^2$. For example, $A^1$ and $A^2$ typically represent unsubstituted phenylene or substituted derivatives thereof. The bridging radical Y is most often a hydrocarbon group and particularly a saturated group such as methylene, cyclohexylidene or isopropylidene. The most preferred polycarbonates are bisphenol A polycarbonates, in which each of $A^1$ and $A^2$ is p-phenylene and Y is isopropylidene. Preferably, the weight average molecular weight of the initial polycarbonate composition ranges from about 5,000 to about 100,000; more preferably, from about 25,000 to about 65,000.

The polyphenylene ethers are known polymers having structural units of the formula

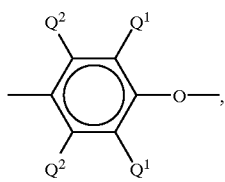

(II)

wherein each $Q^1$ is independently halogen, primary or secondary lower alkyl, phenyl, haloalkyl, aminoalkyl, hydrocarbonoxy, or halohydrocarbonoxy wherein at least two carbon atoms separate the halogen and oxygen atoms, and each $Q^2$ is independently hydrogen, halogen, primary or secondary lower alkyl, phenyl, haloalkyl, hydrocarbonoxy or halohydrocarbonoxy as defined for $Q^1$.

Both homopolymer and copolymer polyphenylene ethers are included. The preferred homopolymers are those containing 2,6-dimethyl-1,4-phenylene ether units. Suitable copolymers include random copolymers containing such units in combination with (for example) 2,3,6-trimethyl-1, 4-phenylene ether units. Also included are polyphenylene ethers containing moieties prepared by grafting onto the polyphenylene ether in known manner such materials as vinyl monomers or polymers such as polystyrenes and elastomers, as well as coupled polyphenylene ethers in which coupling agents such as low molecular weight polycarbonates, quinones, heterocycles and formals undergo reaction in known manner with the hydroxy groups of two polyphenylene ether chains to produce a higher molecular weight polymer, provided a substantial proportion of free OH groups remains.

The polyphenylene ethers generally have an intrinsic viscosity greater than about 0.1, most often in the range of about 0.25–0.6 and especially 0.4–0.6 dl./g., as measured in chloroform at 25° C.

The polyphenylene ethers are typically prepared by the oxidative coupling of at least one monohydroxyaromatic compound such as 2,6-xylenol or 2,3,6-trimethylphenol. Catalyst systems are generally employed for such coupling; they typically contain at least one heavy metal compound such as a copper, manganese or cobalt compound, usually in combination with various other materials.

Particularly useful polyphenylene ethers for many purposes are those which comprise molecules having at least one aminoalkyl-containing end group. The aminoalkyl radical is covalently bound to a carbon atom located in an ortho position to the hydroxy group. Products containing such end groups may be obtained by incorporating an appropriate primary or secondary monoamine such as di-n-butylamine or dimethylamine as one of the constituents of the oxidative coupling reaction mixture. Also frequently present are 4-hydroxybiphenyl end groups and/or biphenyl structural units, typically obtained from reaction mixtures in which a by-product diphenoquinone is present, especially in a copper-halide-secondary or tertiary amine system. A substantial proportion of the polymer molecules, typically constituting as much as about 90% by weight of the polymer, may contain at least one of said aminoalkyl-containing and 4-hydroxybiphenyl end groups.

It will be apparent to those skilled in the art from the foregoing that the polyphenylene ethers contemplated for use in the invention include all those presently known, irrespective of variations in structural units or ancillary chemical features.

The preferred thermoplastic polymers for many purposes are polycarbonates, polyesters, polyphenylene ethers, HIPS and styrene-acrylonitrile copolymers (SAN), including ABS copolymers. These may be employed individually or as blends. Especially preferred are polyphenylene ether-HIPS blends, polycarbonate-SAN blends and polycarbonate-polyester blends.

The flame retardant additive is an aromatic bisphosphoramidate having formula I in which A may be any monocyclic aromatic radical. Included are aromatic hydrocarbon radicals and substituted radicals wherein the substituents may be, for example, alkyl, alkoxy, nitro or carbalkoxy groups. The preferred aromatic radicals are phenyl, 2,6-dialkylphenyl (especially 2,6-xylyl) and 2,4-6-trialkylphenyl (especially 2,4,6-trimethylphenyl). Each $R^1$ radical is primary or secondary $C_{1-4}$ alkyl, preferably methyl, or both of said radicals taken together are ethylene.

Bisphosphoramidates of the desired molecular structure may be prepared by the reaction of a corresponding tertiary diamine such as piperazine or N,N'-dimethylethylenediamine with a diaryl chlorophosphate of the formula $(AO)_2POCl$ in the presence of a tertiary amine. This method of preparation is described in Talley, *J. Chem. Eng. Data*, 33, 221–222 (1988), the disclosure of which is incorporated by reference herein.

The resinous compositions of this invention contain a flame retarding amount of the bisphosphoramidate. This amount is typically in the range of about 0.25–2.5 parts of phosphorus per 100 parts of resinous materials (phr), all percentages herein being by weight. Total amounts of bisphosphoramidate are most often in the range of about 5–35 phr.

Said compositions may also contain other conventional additives including inhibitors, plasticizers, fillers, mold release agents and anti-drip agents. The latter are illustrated by tetrafluoroethylene polymers, including copolymers with such other monomers as styrene and acrylonitrile.

A principal characteristic of the compositions of the invention is their improved high temperature properties. These are demonstrated by the fact that the decrease in glass transition temperature (Tg) exhibited as a result of the incorporation of the aromatic bisphosphoramidate in the composition is substantially less than the corresponding decrease exhibited in blends containing, for example, bis (diaryl phosphates) of dihydroxyaromatic compounds as flame retardants. This is true when each flame retardant is employed in an amount suitable to provide a V-0 rating in the UL-94 test procedure. In the case of phase-separated blends such as polycarbonate-ABS blends, the decrease in Tg is noted in the polycarbonate phase.

Experience has shown that the flame retarding properties of a phosphate-based compound as an additive in a resinous composition are generally proportional to the amount of phosphorus in the composition rather than to the amount of the compound itself. Thus, equal weights of two additives having different molecular weights but the same flame retarding properties may produce different UL-94 results, but amounts of the two additives which contribute the same proportion of phosphorus to the resinous composition will produce the same UL-94 results. On the other hand, other physical properties such as high temperature resistance are dependent on the amount of the compound itself and relatively independent of the phosphorus proportion therein. For this reason, the dependence of flame retarding and high temperature resistance of compositions containing two phosphorus-based compounds may not follow the same pattern.

It has been shown, however, with respect to the aromatic biphosphoramidate employed according to the present invention that their superior properties of flame retardance and high temperature resistance are consistent. Thus, for example, proportions of the prior art additive resorcinol bis(di-2,6-xylyl phosphate) effective to confer a suitable flame-out time on certain resinous compositions are similar to those produced by a typical bis(2,6-xylyl) phosphoramidate at an essentially equivalent level of phosphorus, but the bisphosphoramidate has a substantially lower tendency to decrease HDT despite the slightly greater amount of the bulk additive.

The invention is illustrated by the following examples. All parts and percentages are by weight. Intrinsic viscosity was determined in chloroform at 25° C. HDT values were determined at 264 psi (1820 kPa) according to ASTM procedure D648.

Example 1

Blends of various amounts of a bisphenol A homopolycarbonate, 6.5 parts of a commercially available high rubber graft ABS copolymer and 9 parts of a commercially available SAN copolymer were prepared under identical conditions by blending in a Henschel mixer followed by extrusion on a twin screw extruder and were molded into test specimens. The blends also contained conventional additives including 0.4 part of a tetrafluoroethylene-styrene-acrylonitrile copolymer as an anti-drip agent, which were not considered in determining proportions, and various amounts of the following phosphate-based flame retardant additives: N,N'-bis-[di-(2,6-xylenoxy)phosphinyl] piperazine (XPP), a compound according to formula I wherein A is 2,6-xylyl and whose use is part of the present invention; N,N'-bis(neopentylenedioxy)phosphinyl) piperazine (NPP), a compound of similar structure but not within the scope of the invention; and resorcinol bis(di-2,6-xylyl) phosphate (RDP) and bisphenol A bis(di-2,6-xylyl) phosphate (BPADP), two conventional phosphate-based flame retardants. The FOT and Tg of the polycarbonate phase of each test specimen was determined and the results are given in Table I.

TABLE I

| Sample | 1 | 2 | 3 | 4 |
|---|---|---|---|---|
| Polycarbonate, parts | 72.2 | 76.9 | 73.6 | 71.6 |
| FR, identity | XPP | NPP | RDP | BPADP |
| FR, phr | 12.4 | 6.9 | 10.7 | 13.2 |
| FR, phr P | 1.16 | 1.11 | 0.97 | 1.02 |
| FOT, sec | 19.4 | 84 | 20.3 | 27.3 |
| Tg, ° C. | 131 | 149 | 111 | 112 |

It is apparent that the composition of this invention (Sample 1) had an acceptable FOT and a Tg that differed from that of neat polycarbonate (147° C.) by an acceptable increment. Sample 2 had a Tg essentially equal to that of neat polycarbonate but the FOT was unacceptably high. Samples 3 and 4, employing conventional FR's, had unacceptably low Tg's. The variations in FR content in terms of phr of total FR and of phosphorus are not considered significant from the standpoint of properties.

Example 2

Blends of 62 parts of a commercially available poly(2,6-dimethyl-1,4-phenylene ether) and 38 parts of a commercially available HIPS were prepared and molded under identical conditions similar to those of Example 1. The blends also contained conventional additives including 0.21 part of a tetrafluoroethylene-styrene-acrylonitrile copolymer as an anti-drip agent, which were not considered in determining proportions, and 20.5 phr of XPP, RDP and BPADP as phosphate-based flame retardant additives. The FOT and heat deflection temperature (HDT) of each test specimen was determined and the results are given in Table II.

TABLE II

| Sample | 5 | 6 | 7 |
|---|---|---|---|
| FR, identity | XPP | RDP | BPADP |
| FR, phr P | 1.92 | 1.85 | 1.58 |
| FOT, sec | 2.4 | 2.1 | 3.7 |
| HDT, ° C. | 223.9 | 177.9 | 190.5 |

Again, it is apparent that the composition of the invention (Sample 5) had acceptable FR properties and a significantly higher HDT than the compositions containing conventional FR additives, indicating superior high temperature properties.

Example 3

A blend of 40 parts of a commercially available poly(2,6-dimethyl-1,4-phenylene ether) and 60 parts of a commercially available HIPS were prepared and molded under conditions similar to those of Example 2, using N,N'-bis[di-(2,6-xylenoxy)phosphinyl]ethylenediamine as the flame retardant material in essentially the same proportion. The observed FOT was 3.4 seconds.

What is claimed is:

1. A composition comprising a major amount of at least one thermoplastic polymer and a minor flame retarding amount of at least one aromatic bisphosphoramidate of the formula

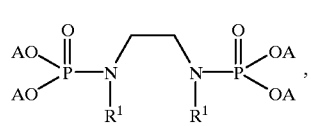

(I)

wherein A is a monocyclic aromatic radical and $R^1$ is a $C_{1-4}$ primary or secondary alkyl radical or both $R^1$ radicals taken together are ethylene.

2. A composition according to claim 1 wherein the thermoplastic polymer is at least one of polycarbonates, polyphenylene ethers, high impact polystyrenes or styrene-acrylonitrile copolymers.

3. A composition according to claim 2 wherein the thermoplastic polymer is a polyphenylene ether-high impact polystyrene blend.

4. A composition according to claim 3 wherein the polyphenylene ether is a poly(2,6-dimethyl-1,4-phenylene ether).

5. A composition according to claim 2 wherein the thermoplastic polymer is a blend of polycarbonate and a styrene-acrylonitrile copolymer.

6. A composition according to claim 5 wherein the polycarbonate is a bisphenol A polycarbonate.

7. A composition according to claim 5 wherein the styrene-acrylonitrile copolymer is an ABS copolymer.

8. A composition according to claim 2 wherein A is phenyl, 2,6-xylyl or 2,4,6-trimethylphenyl.

9. A composition according to claim 8 wherein A is 2,6-xylyl.

10. A composition according to claim 2 wherein $R^1$ is methyl.

11. A composition according to claim 2 wherein both $R^1$ radicals taken together are ethylene.

12. A composition according to claim 2 wherein the amount of bisphosphoramidate is in the range of about 0.25–2.5 parts by weight of phosphorus per 100 parts of resinous materials.

13. A composition according to claim 2 further containing an anti-drip agent.

* * * * *